(12) United States Patent
Kijima et al.

(10) Patent No.: US 12,476,648 B2
(45) Date of Patent: Nov. 18, 2025

(54) NOISE SHAPING SUCCESSIVE-APPROXIMATION REGISTER (SAR) ANALOG-TO-DIGITAL CONVERTER (ADC)

(71) Applicant: Cypress Semiconductor Corporation, San Jose, CA (US)

(72) Inventors: Masashi Kijima, Aichi (JP); Rajiv Singh, Bothell, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 174 days.

(21) Appl. No.: 18/358,681

(22) Filed: Jul. 25, 2023

(65) Prior Publication Data

US 2025/0038757 A1    Jan. 30, 2025

(51) Int. Cl.
*H03M 1/06* (2006.01)
*H03M 1/08* (2006.01)

(52) U.S. Cl.
CPC ..................................... *H03M 1/08* (2013.01)

(58) Field of Classification Search
CPC .... H03M 1/468; H03M 3/426; H03M 1/0854; H03M 1/46; H03M 1/08; H03M 1/1245; H03M 1/462; H03M 3/342; H03M 3/452; H03M 1/06; H03M 1/0626; H03M 1/12; H03M 1/38; H03M 1/466; H03M 3/438; H03M 3/458; H03M 3/46; H03M 1/00; H03M 1/007; H03M 1/1009; H03M 1/1014; H03M 1/1023; H03M 1/1038; H03M 1/1215; H03M 1/1225; H03M 1/14; H03M 1/145; H03M 1/164; H03M 1/56; H03M 1/804; H03M 3/30; H03M 3/344; H03M 3/382; H03M 3/398; H03M 3/45; H03M 3/464; H03M 3/47
USPC ......................... 341/118–121, 137, 155, 172
See application file for complete search history.

(56) References Cited

U.S. PATENT DOCUMENTS

| | | | |
|---|---|---|---|
| 11,424,754 B1 * | 8/2022 | Berens | H03M 1/1057 |
| 2016/0352351 A1 * | 12/2016 | Miki | H03M 1/0626 |
| 2017/0317683 A1 * | 11/2017 | Bandyopadhyay | H03M 3/426 |
| 2018/0183456 A1 * | 6/2018 | Lee | H03M 1/442 |
| 2019/0131989 A1 * | 5/2019 | Maurino | H03M 3/452 |
| 2020/0119744 A1 * | 4/2020 | Lin | H03M 1/0854 |
| 2021/0266004 A1 * | 8/2021 | Guo | H03M 3/426 |
| 2021/0278474 A1 * | 9/2021 | Ravinuthula | G01R 31/3648 |
| 2023/0291413 A1 * | 9/2023 | Park | H03M 1/38 |
| 2023/0370083 A1 * | 11/2023 | Obata | H03M 1/0854 |
| 2024/0137040 A1 * | 4/2024 | Sanyal | H03M 1/60 |
| 2024/0356559 A1 * | 10/2024 | Oh | H03M 1/462 |
| 2025/0055421 A1 * | 2/2025 | Cristofoli | H03F 3/211 |

FOREIGN PATENT DOCUMENTS

| | | | | |
|---|---|---|---|---|
| CN | 114726370 | * | 7/2022 | H03M 1/38 |
| CN | 114726370 A | * | 7/2022 | H03M 1/38 |

* cited by examiner

*Primary Examiner* — Linh V Nguyen

(57) ABSTRACT

A noise-shaping successive-approximation register (SAR) analog-to-digital converter (ADC) (SAR ADC) including a noise-shaping (NS) filter, a comparator, a differential input path between the NS filter and the comparator, and a cross-coupled set of capacitive elements coupled to the differential input path.

18 Claims, 6 Drawing Sheets

NOISE SHAPING SUCCESSIVE-APPROXIMATION REGISTER (SAR) ANALOG-TO-DIGITAL CONVERTER (ADC)

TECHNICAL FIELD

This disclosure relates generally to analog-to-digital converters (ADCs) and, more particularly, to noise shaping (NS) successive-approximation register (SAR) ADCs.

BACKGROUND

In electronics, an analog-to-digital converter (ADC) is a device for converting an analog input voltage (or current) to a digital number proportional to the magnitude of the voltage (or current). ADCs can convert an input analog signal into a digital signal before digital signal processing. A successive-approximation register (SAR) ADC is one type of ADC. A SAR ADC uses a comparator to reject ranges of voltages, eventually settling on a final voltage range. Successive approximation works by constantly comparing the input voltage to the output of an internal digital-to-analog converter (DAC), which is fed by the current value of the approximation until the best approximation is achieved. At each step in this process, a binary value of the approximation is stored in a successive approximation register (SAR). The SAR uses a reference voltage (which is the largest signal the ADC is to convert) for comparisons. Some SAR ADCs include noise shaping (NS) filters to reduce noise (e.g., thermal noise, electrical noise) at the input of the comparator.

DETAILED DESCRIPTION

Figure 1:
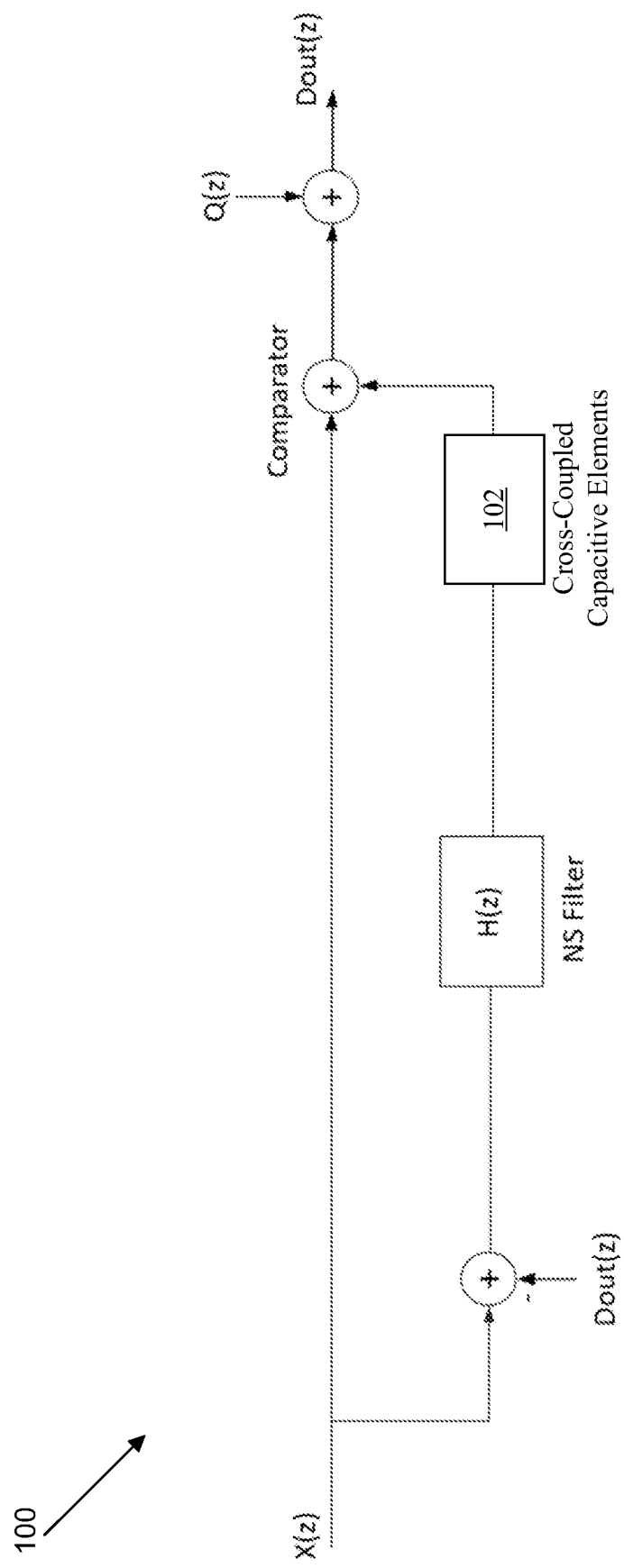
FIG. 1 illustrates a signal flow of a portion of a noise shaping (NS) successive-approximation register (SAR) analog-to-digital converter (ADC) with cross-coupled capacitive elements, according to one embodiment.

The technology described herein is directed to reducing kickback noise at an input of a comparator for an analog-to-digital converter (ADC) featuring a noise shaping (NS) filter. Exemplary embodiments described herein may include successive-approximation register (SAR) ADCs. However, this is not intended to be limiting. The technology described herein may be applied to various circuit designs that feature equalizing a differential signal having at least two differential signal input paths.

Generally speaking, the comparator of a SAR ADC equalizes differential signals carried to the comparator during each SAR conversion phase. However, this equalization causes voltage swings at the comparator's input stage. These voltage swings cause other upstream circuitry, like an NS filter, to receive kickback noise (e.g., voltage swings) at their output stage(s). This is problematic, as kickback noise at the output stages of circuitry upstream from the comparator can affect an output digital code of the SAR ADC. As such, during the SAR conversion phase, differential signals at the output stages of circuitry upstream from the comparator should be as stable as possible. For example, many analog front ends (AFE) of battery management systems (BMSs) require millivolt accuracy to remain competitive technologically. During the SAR conversion phase, kickback noise at an output of the NS filter causes the comparator's wrong decisions and degrades ADC and AFE accuracy.

A solution to the problem described above includes coupling appropriately sized decoupling capacitors to the output stages of the upstream circuitry. A decoupling capacitor would help reduce voltage swing noise seen by the output stage of the NS filter by attenuating the voltage swing. However, this attenuation is directly proportional to the size of the decoupling capacitor. To meaningfully reduce kickback noise on the upstream circuitry, the decoupling capacitors would need to be bulky, cumbersome, and use a large amount of space on an electronic chip.

Another solution to the problem described above includes using a high-powered operational amplifier on the last stage of the NS filter. High-powered amplifiers have the advantages of low noise, wide bandwidth, and fast settling times. However, high-powered amplifiers are generally used in high-power environments and applications. Here, the amplifier is in a low-power environment (i.e., on the last stage of the NS filter). Thus, a high-powered amplifier is impractical. Additionally, high-powered operational amplifiers are expensive.

Aspects and embodiments described herein may address the above and other deficiencies by providing a cheaper, smaller solution that reduces or cancels kickback noise caused by equalization by the comparator during the SAR conversion phase. Aspects and embodiments of the present disclosure address/overcome the problems described above and others by providing NS SAR ADC with a set of capacitive elements cross-coupled between an equalizer of the comparator and the NS filter (e.g., the upstream circuitry).

A SAR ADC may have an NS filter and a comparator. A differential input path may be between the NS filter and the comparator. A cross-coupled set of capacitive elements may be coupled to the differential input path. The comparator may include a pre-amplifier with equalization. The pre-amplifier may add together two or more signals received by the comparator and level-shift the added signals. The cross-coupled set of capacitive elements is configured to cancel a voltage swing on the differential input path in response to the equalization of signals by the comparator. In some embodiments, the cross-coupled set of capacitive elements may be transistors having a shorted source and drain. In other embodiments, the cross-coupled set of capacitive elements may be capacitors or electrical traces separated by an insulative material.

FIG. 1 illustrates a signal flow 100 of a portion of a noise shaping (NS) successive-approximation register (SAR) analog-to-digital converter (ADC), according to one embodiment. The signal flow 100 includes a comparator with at least one input path to receive input signals X(z). Input signals X(z) may be two differential signals (e.g., V1+ and V1−). One or more signals from an NS filter H(z) may be combined with one or more of the input signals X(z)(i) at the comparator or (ii) before the comparator. The one or more signals from the NS filter H(z) may also be differential signals (e.g., V2+ and V2−).

The comparator then compares voltages (e.g., V1+ combined with V2+ compared to V1− combined with V2−) and outputs a digital signal. In response to the comparator outputting the digital signal, the NS SAR ADC enters a SAR conversion phase. During the SAR conversion phase, the compared voltages are equalized by an equalizer. This equalization of voltages causes kickback noise (e.g., one or more voltage swings) to occur at an output stage of the NS filter. The kickback noise is reduced or canceled by the cross-coupled capacitive elements 102. The cross-coupled capacitive elements 102 may be cross-coupled between the output stage of the NS filter and an input stage of the comparator.

The digital signal is combined with a quantization error Q(z) and outputted as Dout(z). Dout(z) may be inversely combined with input signal X(z) and used as an input for the NS filter H(z). In some embodiments, Dout(z) may be characterized by the following equations:

$$Dout(z) = X(z) + (X(z-1) - Dout(z-1))H(z) + Q(z) \quad (1)$$

$$Dout(z) = X(z) + Q(z) / (1 + H(z)z^{-1}) \quad (2)$$

Figure 2:
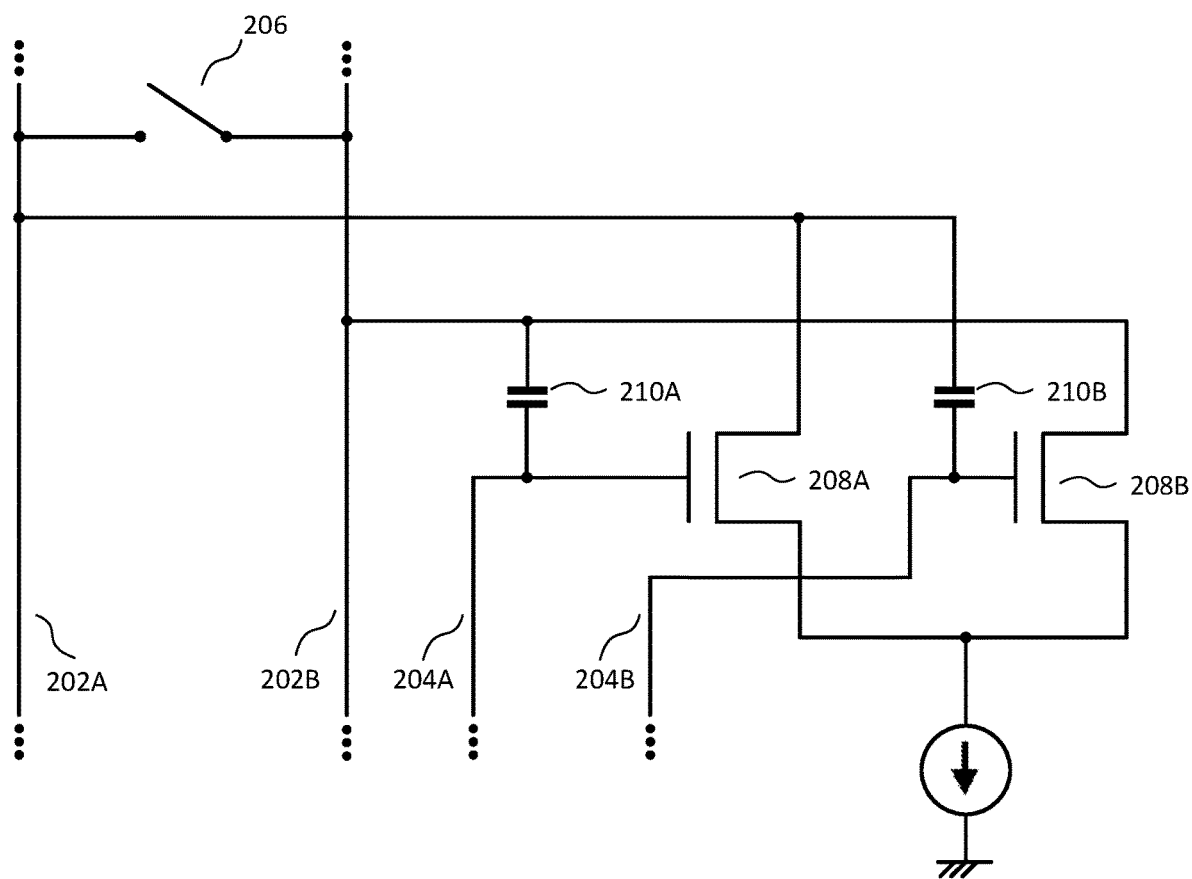
FIG. 2 is a circuit diagram having differential input paths with a set of cross-coupled capacitive elements, according to one embodiment.

FIG. 2 is a circuit diagram having differential input paths with a set of cross-coupled capacitive elements, according to one embodiment. First input lines 202A-B may carry a first pair of differential signals. The first input lines 202A-B may form a first input path. Second input lines 204A-B may carry a second pair of differential signals. The second input lines 204A-B may form a second input path. The first pair of differential signals may be a combination of the second pair of differential signals and a third pair of differential signals. A switch 206 may be configured to create a short between the first input lines 202A-B at regular intervals. The switch 206 may also be any device configured to create a short between the first input lines 202A-B.

Upon activation of the switch 206, the first pair of differential signals may be equalized. The equalization of the first pair of differential signals may cause a first voltage swing on the first input line 202A and a second voltage swing on the second input line 202B. The first and second voltage swings may have substantially identical properties, but have opposite polarities.

The first voltage swing may cause a first amount of kickback noise on the second input line 204A through a gate-drain capacitance of a first transistor 208A. To reduce or cancel the first amount of kickback noise, a capacitive element 210A is coupled between the second input line 204A and the first input line 202B. By doing so, the capacitive element 210A introduces a first additional amount of kickback noise caused by the second voltage swing. The first additional amount of kickback noise may be similar in amplitude or frequency to the second amount of kickback noise, which is also caused by the second voltage swing on the first input line 202B. Similarities between the second amount of kickback noise and the first additional amount of kickback noise may depend on one or more capacitive properties of (i) the first transistor 208A and (ii) the capacitive element 210A. For example, the second amount of kickback noise and the first additional amount of kickback noise are substantially the same responsive to a capacitance value of the capacitive element 210A substantially matching the gate-drain capacitance of the first transistor 208A at a predetermined voltage. In some embodiments, due to the opposite-polarity characteristics of the first and second amounts of kickback noise, the first amount of kickback noise is canceled by the first additional amount of kickback noise if the first additional amount of kickback noise is substantially the same as the second amount of kickback noise.

Similarly, the second voltage swing may cause a second amount of kickback noise on the second input line 204B through a gate-drain capacitance of a second transistor 208B. To reduce or cancel the second amount of kickback noise, a capacitive element 210B is coupled between the second input line 204B and the first input line 202A. By doing so, the capacitive element 210B introduces a second additional amount of kickback noise caused by the first voltage swing. The second additional amount of kickback noise may be similar in amplitude or frequency to the first amount of kickback noise, which is also caused by the first voltage swing on the first input line 202A. Similarities between the first amount of kickback noise and the second additional amount of kickback noise may depend on capacitive properties of (i) the second transistor 208B and (ii) the capacitive element 210B. For example, the first amount of kickback noise and the second additional amount of kickback noise are substantially the same responsive to a capacitance value of the capacitive element 210B substantially matching the gate-drain capacitance of the second transistor 208B at a predetermined voltage. In some embodiments, due to the opposite-polarity characteristics of the first and second amounts of kickback noise, the second amount of kickback noise is canceled by the second additional amount of kickback noise if the second additional amount of kickback noise is substantially the same as the first amount of kickback noise.

In some embodiments, the first and second transistors 208A-B form a transistor pair (e.g., a transistor differential pair sharing a common source). One with skill in the art would appreciate that the capacitances of the capacitive elements 210A-B are configured to match the gate-drain capacitances of the transistor pair. Matching these capacitances may result in cancelation of kickback noise on the second input lines 204A-B. In other embodiments, the capacitances of the capacitive elements 210A-B do not match the gate-drain capacitances of the transistor pair. In these embodiments, the first and second amounts of kickback noise may only be reduced.

The capacitive elements 210A-B may be capacitors or traces separated by an insulative material. In other embodiments, the capacitive elements 210A-B may be transistors having a shorted source and drain. The capacitive elements 210A-B may be field effect transistors (FETs). These FETs may have physical properties proportionally related to the transistor pair. In one exemplary embodiment, the capacitive element 210A, as a FET, includes a gate (i) similar to a length of a gate of the first transistor 208A and (ii) substantially half a width of the gate of the first transistor 208A. Similarly, the capacitive element 210B as a FET may have a gate (i) similar to a length of a gate of the second transistor 208B and (ii) is substantially half a width of the gate of the second transistor 208B.

In some embodiments, the capacitive elements 210A-B are configured to have similar capacitance properties to one or more of the first transistor 208A or the second transistor 208B. The capacitance properties of the capacitive elements may include one or more of static capacitance value, variable capacitance value at a predetermined voltage, working voltage, tolerance, leakage current, working temperature, or polarization. In embodiments where the first and second transistors 208A-B form a transistor pair, the capacitive elements 210A-B may have one or more similar capacitance properties to the gate-drain capacitance properties of the transistor pair. Notwithstanding the aforementioned embodiments, one with skill in the art will appreciate that any physical configuration of capacitive elements 210A-B that results in the capacitances of capacitive elements 210A-B matching the gate-drain capacitances of the first and second transistors 208A-B at a predetermined voltage will facilitate reducing or canceling secondary voltage swings at second input lines 204A-B.

Figure 3A:
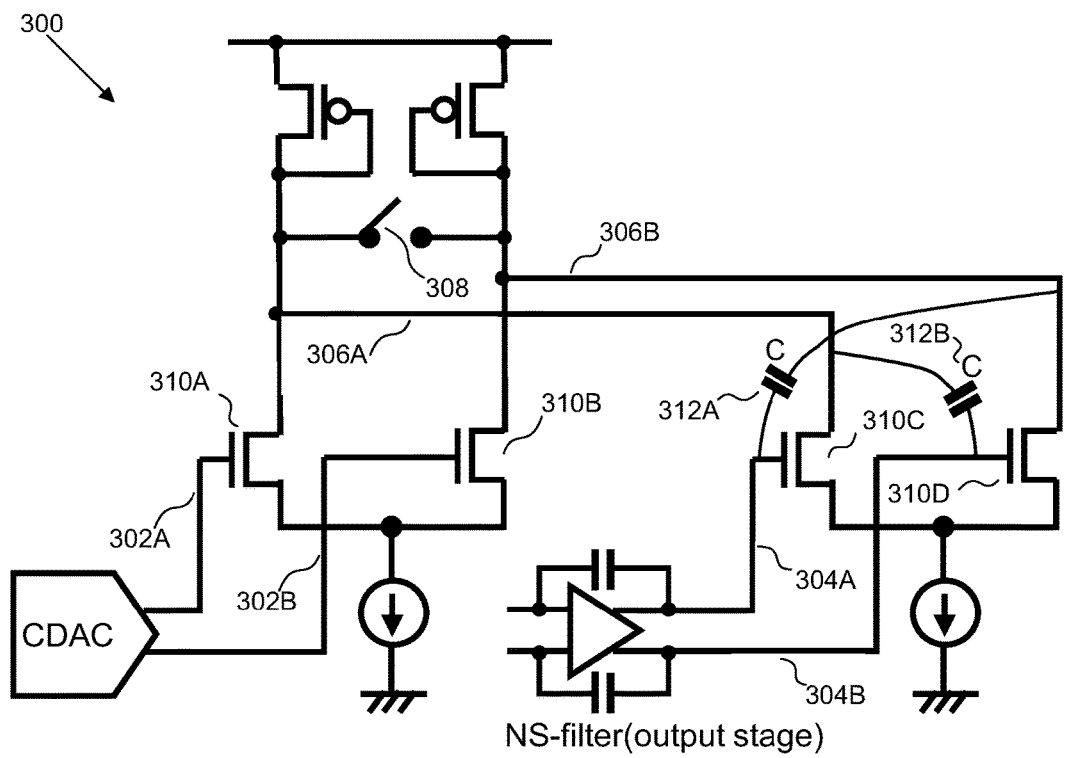
FIG. 3A is a circuit diagram of input paths to a comparator of an NS SAR ADC with capacitive elements cross-coupled to an NS filter input path, according to one embodiment.

FIG. 3A is a circuit diagram 300 of input paths to a comparator of an NS SAR ADC with capacitive elements cross-coupled to an NS filter input path, according to one embodiment. First input lines 302A-B may be coupled to an output of a capacitive digital-to-analog converter (CDAC). SAR logic provides a digital signal to the CDAC. The first input lines 302A-B may form a first input path. The CDAC may provide a set of differential analog signals to the first input lines 202A-B. Second input lines 304A-B may be coupled to an output stage of an NS filter. The second input lines 304A-B may form a second input path The NS filter may provide a set of differential analog signals to the second input lines 304A-B. Third input lines 206A-B may be coupled to an equalizer 308. The equalizer 308 may be configured to create a short between the third input lines 306A-B at regular intervals. In some embodiments, the equalizer 308 is a switch. The switch may include one or more transistors. The comparator may include the third input lines 306A-B and the equalizer 308. In other embodiments, the third input lines 306A-B are coupled to an input state of the comparator, which includes the equalizer 308.

The third input lines 306A-B may create at least two input paths with a first input path corresponding to the first input lines 302A-B and a second input path corresponding to the second input lines 304A-B. The first input line 302A may be coupled to the third input line 306A by a first transistor 310A. The first input line 302A may be coupled to a ground portion of the first transistor 310A, while the third input line 306A may be coupled to a drain portion of the first transistor 310A. The first input line 302B may similarly be coupled to the third input line 306B by a second transistor 310B. In some embodiments, the first and second transistors 302A-B form a transistor pair (e.g., a transistor differential pair).

The second input line 304A may be coupled to the third input line 306A by a third transistor 310C. The second input line 304A may be coupled to a ground portion of the third transistor 310C, while the third input line 306A may be coupled to a drain portion of the third transistor 310C. The second input line 304B may similarly be coupled to the third input line 306B by a fourth transistor 310D. In most embodiments, the third and fourth transistors 210C-D form a transistor pair.

The first input lines 302A-B may carry a first set of differential signals. The second input lines 304A-B may carry a second set of differential signals. The first and second sets of differential signals may be combined on the third input lines 306A-B. In some embodiments, signals carried by the third input lines 306A-B are differential signals. In response to activation of the equalizer 308, the differential signals carried the third input lines 306A-B, are equalized. The equalization of signals causes opposite-polarity voltage swings on the third input lines 306A-B. In some embodiments, the equalization of signals occurs during each SAR conversion phase.

By way of example, the equalization of signals carried by the third input lines 306A-B is discussed. In one embodiment, the first input line 302A carries a signal V1+, the first input line 302B carries a signal V1−, the second input line 304A carries a signal V2+, and the second input line 304B carries a signal V2−. In this example, the signals V1+ and V1− are a first set of differential signals and the signals V2+ and V2− are a second set of differential signals. The signals V1+ and V2+ are combined on the input line 306A to create a signal V3+. The signals V1− and V2− are combined on the input line 306B to create a signal V3−. In some embodiments, the signals V3+ and V3− are a third set of differential signals. Responsive to initiating a SAR transition phase, the equalizer 308 activates and causes the signals V3+ and V3− to be equalized by a short between the third input lines 306A-B. The combination of the signals V3+ and V3− causes opposite-polarity voltage swings on the third input lines 306A-B. A first voltage swing on the third input line 306A causes a first amount of kickback noise on the second input line 304A via a gate-drain capacitance of the third transistor 310C. A second voltage swing on the third input line 306B causes a second amount of kickback noise on the second input line 304B via a gate-drain capacitance of the fourth transistor 310D. Because the first voltage swing and the second voltage swing are of opposite polarity, the first and second amounts of kickback noise on the second input lines 304A-B are also of opposite polarity.

To reduce or cancel the first amount of kickback noise on the second input line 304A caused by the first voltage swing, a capacitive element 312A is coupled between the second input line 304A and the third input line 306B. By doing so, the capacitive element 312A introduces a first additional amount of kickback noise caused by the second voltage swing. The first additional amount of kickback noise may be similar in amplitude or frequency to the second amount of kickback noise, which is also caused by the second voltage swing on the third input line 306B. Similarities between the second amount of kickback noise and the first additional amount of kickback noise may depend on capacitive properties of (i) the third transistor 310C and (ii) the capacitive element 312A. For example, the second amount of kickback noise and the first additional amount of kickback noise are substantially the same responsive to a capacitance value of the capacitive element 312A substantially matching the gate-drain capacitance of the third transistor 310C at one or more operating voltage levels. Generally, operating voltage levels fall between a high voltage reference input and a low voltage reference input of the SAR ADC. In some embodiments, due to the opposite-polarity characteristics of the first and second amounts of kickback noise, the first amount of kickback noise is canceled by the first additional amount of kickback noise if the first additional amount of kickback noise is substantially the same as the second amount of kickback noise.

Similarly, to reduce or cancel the second amount of kickback noise on the second input line 304B caused by the second voltage swing, a capacitive element 312B is coupled between the second input line 304B and the third input line 306A. By doing so, capacitive element 312B introduces a second additional amount of kickback noise caused by the first voltage swing. The second additional amount of kickback noise may be similar in amplitude or frequency to the first amount of kickback noise, which is also caused by the first voltage swing on the third input line 306A. Similarities between the first amount of kickback noise and the second additional amount of kickback noise may depend on capacitive properties of (i) the fourth transistor 310D and (ii) the capacitive element 312B. For example, the first amount of kickback noise and the second additional amount of kickback noise are substantially the same responsive to a capacitance value of the capacitive element 312B substantially matching the gate-drain capacitance of the fourth transistor 310D at one or more operating voltage levels . . . . In some embodiments, due to the opposite-polarity characteristics of the first and second amounts of kickback noise, the second amount of kickback noise is canceled by the second additional amount of kickback noise if the second additional amount of kickback noise is substantially the same as the first amount of kickback noise.

In some embodiments, one with skill in the art would appreciate that the capacitances of the capacitive elements 312A-B are configured to match the gate-drain capacitances of the transistor pair third and fourth transistors 310C-D at comparator operating voltage levels. Matching these capacitances may result in cancelation of kickback noise on the second input lines 304A-B. In other embodiments, the capacitance of the capacitive elements 312A-B do not match the gate-drain capacitances of the transistor pair third and fourth transistors 310C-D at comparator operating voltage levels. In these embodiments, the first and second amounts of kickback noise may only be reduced.

In some embodiments, the capacitive elements 312A-B may be capacitors or traces (e.g., the capacitive element 312A is a portion of the second input line 304A and a portion of the third input line 306B) separated by an insulative material. In other embodiments, the capacitive elements 312A-B may be transistors having a shorted source and drain. The capacitive elements 312A-B may be field effect transistors (FETs). These FETs may have physical properties proportionally related to one or more of the third transistor 310C and the fourth transistor 310D. In one exemplary embodiment, the capacitive element 312A, as a FET, includes a gate (i) similar to a length of a gate of the third transistor 310C and (ii) substantially half a width of the gate of the third transistor 310C. Similarly, the capacitive element 312B as a FET may have a gate (i) similar to a length of a gate of the fourth transistor 310D and (ii) is substantially half a width of the gate of the fourth transistor 310D.

In some embodiments, the capacitive elements 312A-B are configured to have similar capacitance properties to one or more of the third transistor 310C or the fourth transistor 310D. Capacitance properties of the capacitive elements may include one or more of static capacitance value, variable capacitance value at a predetermined voltage, working voltage, tolerance, leakage current, working temperature, or polarization. In embodiments where the third and fourth transistors 310C-D form a transistor pair, the capacitive elements 312A-B may have one or more similar capacitance properties to the gate-drain capacitance properties of both the third and fourth transistors 310C-D at comparator operating voltage levels. Notwithstanding the aforementioned embodiments, one with skill in the art will appreciate that any physical configuration of capacitive elements 312A-B that results in the capacitive elements 312A-B and the third and fourth transistors 310C-D having similar capacitance values at comparator operating voltage levels will facilitate reducing or canceling secondary voltage swings at second input lines 304A, 304B.

Figure 3B:
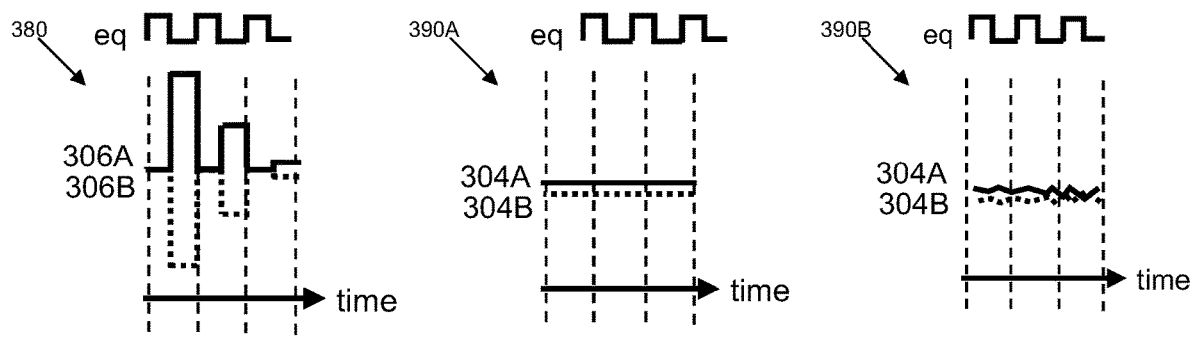
FIG. 3B illustrates a kickback noise seen at an output stage of an NS filter of an NS SAR ADC (i) with cross-coupled capacitive elements and (ii) without cross-coupled capacitive elements, according to one embodiment.

FIG. 3B illustrates and compares a kickback noise seen at an output stage of an NS filter of an NS SAR ADC (i) with cross-coupled capacitive elements and (ii) without cross-coupled capacitive elements, according to one embodiment. Graph 380 depicts voltage levels of signals carried by the third input line 306A (full line) and the third input line 306B (dotted line) in relation to regular intervals of equalization ("eq") over time. Graph 390A depicts reduced or canceled kickback noise carried by the second input line 304A (full line) and the second input line 304B (dotted line) of a NS SAR ADC with the capacitive elements 312A-B. Graph 390B depicts kickback noise carried by the second input line 304A (full line) and the second input line 304B (dotted line) of a NS SAR ADC without the capacitive elements 312A-B. The graphs 390A-B depict the kickback noise in relation to the same regular intervals of equalization ("eq") over time as the graph 380.

Figure 4:
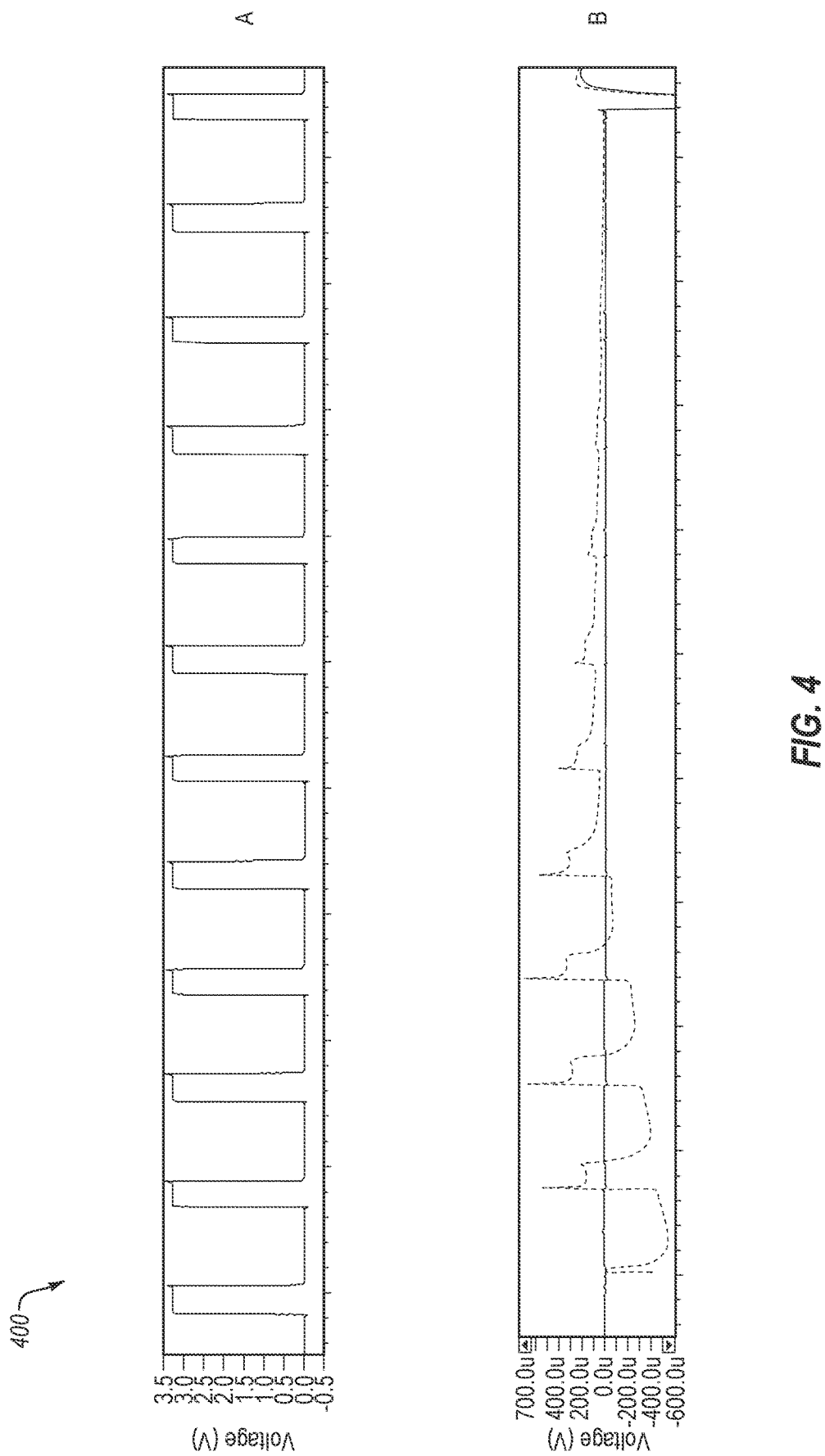
FIG. 4 includes exemplary graphs comparing kickback noise during SAR conversion phase within an NS SAR ADC (i) with cross-coupled capacitive elements and (ii) without cross-coupled capacitive elements, according to one embodiment.

FIG. 4 includes exemplary graphs comparing kickback noise during equalization within a NS SAR ADC (i) with cross-coupled capacitive elements and (ii) without cross-coupled capacitive elements, according to one embodiment.

Graph 4A depicts the equalization cycle of the comparator over time. At times where the signal is approximately 3.0V, the differential signals carried by the third input lines 306A-B are equalized. At times where the signal is approximately 0V, the differential signals are no longer equalized. As discussed above, equalization typically occurs during the SAR conversion phase.

Graph 4B depicts an amount of voltage carried by the second input lines 304A-B (i) with the capacitive elements 312A-B (full line) and (ii) without the capacitive elements 312A-B (dotted line) relative to the equalization cycle of the graph 4A. The voltage carried by the second input lines 304A-B are illustrated as a combination (i.e., voltage carried by the second input line 304A combined with the voltage carried by the second input line 304B). Viewing the graphs 4A-B, one of skill in the art will appreciate how the capacitive elements 312A-B facilitate reduction or cancelation of kickback noise on the second input lines 304A, 304B.

Figure 5:
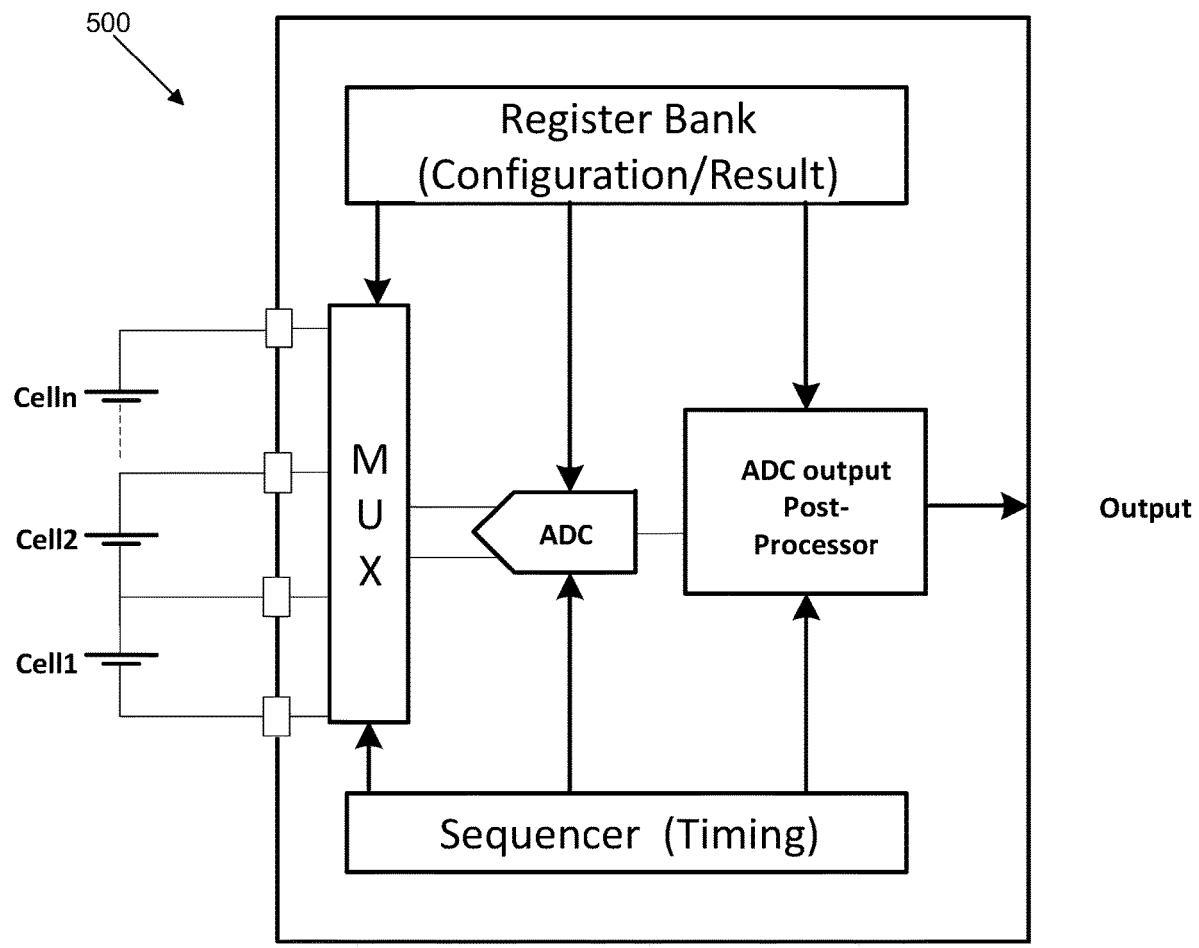
FIG. 5 is a simplified battery management system (BMS) diagram, according to one embodiment.

FIG. 5 is a simplified battery management system (BMS) diagram, according to one embodiment. The BMS may be operatively coupled to a bank of battery cells. Several inputs from battery cells may be time-multiplexed, by a multiplexer (MUX), to a same ADC. The ADC may be a NS SAR ADC having the features described above. A register bank may provide configuration bits for each circuit in a BMS signal path. A sequencer provides timing control signals for the circuits in the BMS signal path. Circuits in the signal path may include at least the MUX, the ADC, and an ADC post-processor. The ADC post-processor may filter the ADC output before sending the signal outside of the BMS.

Figure 6:
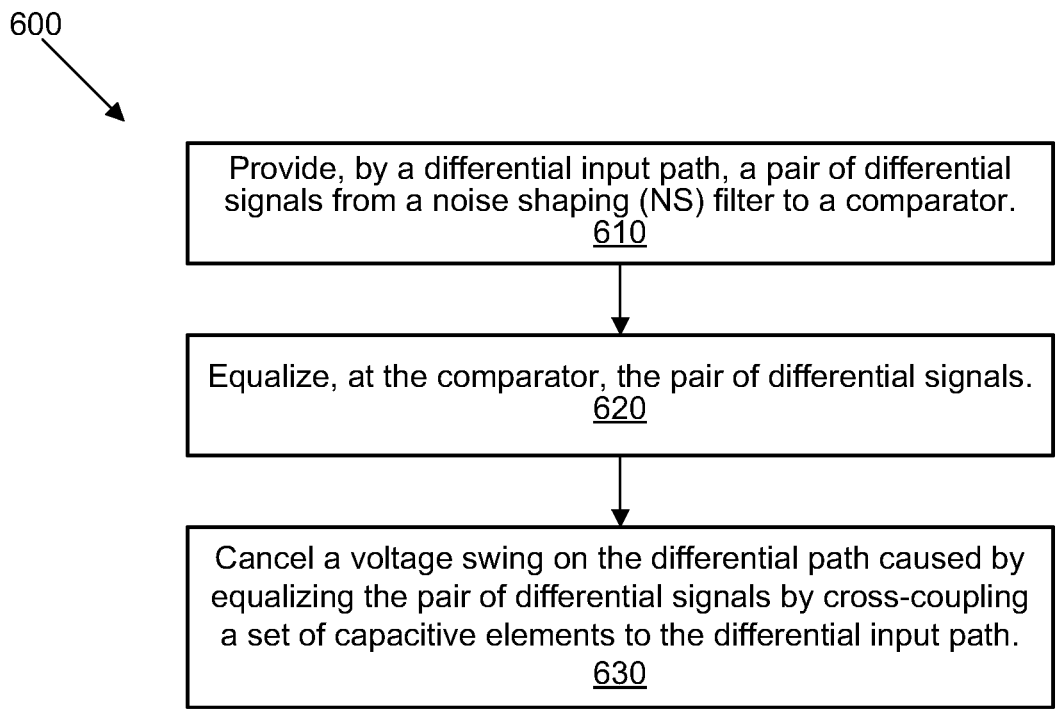
FIG. 6 is a flow diagram illustrating an example method of canceling a voltage swing on a differential path, according to one embodiment.

FIG. 6 is a flow diagram of a method 600 of canceling a voltage swing on a differential path, according to one embodiment. In some embodiments, the method 600 may be performed by manufacturers of ADCs, more particularly manufacturers of NS SAR ADCs. In other embodiments, the method 600 is performed by one or more components of circuitry described in FIG. 3A.

At operation 610, a differential input path provides a pair of differential signals from an NS filter to a comparator. In some embodiments, the differential input path may include only the second input lines 304A, 304B. In other embodiments, the differential input path may include the second input lines 304A, 304B, and the third transistor 310C and fourth transistor 310D. In even other embodiments, the differential input path may include the second input lines 304A, 304B, the third transistor 310C and fourth transistor 310D, and third input lines 306A, 306B.

At operation 620, the comparator equalizes the pair of differential signals. Equalization may be performed by the equalizer 308.

At operation 630, a set of capacitive elements cross-coupled to the differential input path cancels a voltage swing on the differential path caused by equalizing the pair of differential signals. The set of capacitive elements may be cross coupled in a manner similar to capacitive elements 312A-B.

In the above description, numerous details are set forth. It will be apparent, however, to one of ordinary skill in the art having the benefit of this disclosure, that embodiments of the present disclosure may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "applying," "coupling," "communicating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

Embodiments described herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store one or more sets of instructions. The term "computer-readable medium" shall also be taken to include any medium that is capable of storing, encoding, or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details, such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth above are merely exemplary. Particular implementations may vary from these exemplary details and still be contemplated to be within the scope of the present disclosure.

It is to be understood that the above description is intended to be illustrative and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A successive-approximation register (SAR) analog-to-digital converter (ADC) (SAR ADC) comprising:
   a noise-shaping (NS) filter;
   a comparator comprising a first input path coupled to receive a signal and a second input path coupled to the NS filter, wherein the second input path comprises:
      a first transistor pair comprising a first transistor and a second transistor;
      a first capacitive element coupled between a gate of the first transistor and a drain of the second transistor; and
      a second capacitive element coupled between a gate of the second transistor and a drain of the first transistor.

2. The SAR ADC of claim 1, wherein the comparator comprises a pre-amplifier with equalization, wherein the first and second capacitive elements are configured to cancel a voltage swing on the gates of the first and second transistors responsive to equalization of signals on the drains of the first and second transistors.

3. The SAR ADC of claim 2, further comprising:
   a capacitive digital-to-analog converter (CDAC) coupled to the first input path, the CDAC to provide a first pair differential analog signals to a second transistor pair of the pre-amplifier, wherein the second transistor pair is a differential pair, wherein:
   the first transistor pair is a differential pair to provide a second differential analog signal to the comparator; and
   the pre-amplifier is to level-shift the first differential analog signal to a third differential analog signal and add the second differential analog signal to the third differential analog signal.

4. The SAR ADC of claim 1, wherein the first and second capacitive elements have substantially similar capacitance values.

5. The SAR ADC of claim 1, wherein the first capacitive element is a third transistor, wherein a source and a drain of the third transistor are shorted, and the second capacitive element is a fourth transistor, wherein a source and a drain of the fourth transistor are shorted.

6. The SAR ADC of claim 5, wherein a first width of a gate of the third transistor is substantially half a second width of the gate of the first transistor and a first length of the gate of the third transistor is substantially similar to a second length of the gate of the first transistor.

7. The SAR ADC of claim 1, wherein the first capacitive element is one of i) a capacitor or ii) a portion of a first trace separated from a portion of a second trace by an insulative material.

8. A successive-approximation register (SAR) analog-to-digital converter (ADC) (SAR ADC) comprising:
   a noise-shaping (NS) filter;
   a comparator, wherein the comparator comprises a pre-amplifier with equalization;
   a differential input path between the NS filter and the comparator; and
   a cross-coupled set of capacitive elements coupled to the differential input path, wherein the cross-coupled set of capacitive elements are configured to cancel a voltage swing on a portion of the differential input path responsive to equalization of signals by the comparator.

9. The SAR ADC of claim 8, further comprising:
   a capacitive digital-to-analog converter (CDAC) coupled to a second input path, the CDAC to provide a first differential analog signal to a second transistor pair of the pre-amplifier, wherein the second transistor pair is a differential pair, wherein:
   the differential input path is to provide a second differential analog signal to the comparator; and
   the pre-amplifier is to level-shift the first differential analog signal to a third differential analog signal and add the second differential analog signal to the third differential analog signal.

10. The SAR ADC of claim 8, wherein the cross-coupled set of capacitive elements have one or more substantially similar capacitance properties.

11. The SAR ADC of claim 8, wherein the cross-coupled set of capacitive elements are transistors having a shorted source and drain.

12. The SAR ADC of claim 11, wherein the transistors each comprise one or more similar capacitance properties between a gate and the shorted source and drain.

13. The SAR ADC of claim 8, wherein the cross-coupled set of capacitive elements are one of i) capacitors or ii) traces separated by an insulative material.

14. A system comprising:
   a bank of battery cells; and
   a battery management system (BMS) operatively coupled to the bank of battery cells, the BMS comprising a successive-approximation register (SAR) analog-to-digital converter (ADC) (SAR ADC), wherein the SAR ADC comprises:
      a noise-shaping (NS) filter;
      a comparator;
      a differential input path between the NS filter and the comparator; and
      a cross-coupled set of capacitive elements coupled to the differential input path, wherein the cross-coupled set of capacitive elements are transistors having a shorted source and drain.

15. The system of claim 14, wherein the comparator comprises a pre-amplifier with equalization, wherein the cross-coupled set of capacitive elements are configured to cancel a voltage swing on a portion of the differential input path responsive to equalization of signals by the comparator.

16. The system of claim 15, further comprising:
   a capacitive digital-to-analog converter (CDAC) coupled to a second input path, the CDAC to provide a first differential analog signal to a second transistor pair of the pre-amplifier, wherein the second transistor pair is a differential pair, wherein:
   the differential input path is to provide a second differential analog signal to the comparator; and
   the pre-amplifier is to level-shift the first differential analog signal to a third differential analog signal and add the second differential analog signal to the third differential analog signal.

17. The system of claim 14, wherein the transistors each comprise substantially similar capacitance properties between a gate and the shorted source and drain.

18. The system of claim 14, wherein the cross-coupled set of capacitive elements are one of i) capacitors or ii) traces separated by an insulative material.

* * * * *